United States Patent
Konno (10) Patent No.: US 7,315,171 B2
(45) Date of Patent: Jan. 1, 2008

(54) ELECTRONIC JUDGING APPARATUS FOR WORKING STATE OF THE EQUIPMENT

(75) Inventor: Akira Konno, 66-3 Aza Kitakami Nakano, Miyagino-ku, Sendai City, Miyagi (JP) 983-0013

(73) Assignee: Akira Konno, Sendai Miyagi (JP)

( * ) Notice: Subject to any disclaimer, the term of this patent is extended or adjusted under 35 U.S.C. 154(b) by 0 days.

(21) Appl. No.: 11/542,391

(22) Filed: Oct. 4, 2006

(65) Prior Publication Data
US 2007/0108988 A1    May 17, 2007

(30) Foreign Application Priority Data
Oct. 25, 2005   (JP)  .............................. 2005-309405

(51) Int. Cl.
*G01R 29/26*    (2006.01)
*G01R 15/18*    (2006.01)
(52) U.S. Cl. .................. 324/613; 324/127; 324/628
(58) Field of Classification Search ................ 324/529, 324/613, 127
See application file for complete search history.

(56) References Cited

U.S. PATENT DOCUMENTS

| 4,263,549 | A | * | 4/1981 | Toppeto ....................... 324/127 |
| 5,180,985 | A | * | 1/1993 | Zoccarato et al. .......... 324/613 |
| 5,223,795 | A | * | 6/1993 | Blades ......................... 324/536 |
| 5,789,928 | A | * | 8/1998 | Baker ........................... 324/623 |
| 5,973,501 | A | * | 10/1999 | Reichard ..................... 324/623 |
| 6,608,741 | B1 | * | 8/2003 | Macbeth ....................... 361/42 |
| 6,667,685 | B2 | * | 12/2003 | Wasaki et al. ............... 375/285 |
| 6,690,230 | B2 | * | 2/2004 | Pelly ............................ 327/552 |

* cited by examiner

*Primary Examiner*—Anjan Deb (57) ABSTRACT

The invention provides the electronic judging apparatus to detect the working state of the other electric equipment without modifying it inside. The common mode noise around the electric power supplying wires of the other equipment is measured by using the special magnetic core detector attached around the power supplying wire, and the common mode noise is compared with the one measured on the non-working time after amplifying and digital signal treatment of the detected signal. As the modification of the equipment is not required, the monitoring of the working state can be available for various equipments easily and also available from a remote place by transmitting the digital treated signal on the internet communication system.

3 Claims, 5 Drawing Sheets

ELECTRONIC JUDGING APPARATUS FOR WORKING STATE OF THE EQUIPMENT

BACKGROUND OF THE INVENTION

1. Field of the Invention

The present invention relates to an electronic apparatus with automatic judging function for the working state of the other equipment.

2. Description of Related Art

Conventional example of the electronic judging method for the working state of the other equipment is presented in Japanese Patent Application Laid-Open No. 1999-55761. Conventional examples for detecting operation state of the related system are presented in U.S. Pat. No. 5,570,418 and U.S. Pat. No. 4,310,844.

The conventional methods of the electronic judging for the working state of the other equipment are explained with the following examples. The first example of them is the method utilizing the electric switch situated common to the operation switch of the other equipment itself.

The second example is the way to use the electric limit switch with mechanical contact movement or semiconductor limit switch with magnetic field for detecting the position of the equipment.

The third example is the way to use the non-contact detectors like a photo coupler or a current transformer on the occasion of electrically non-contact application. The method of photo coupler is the way to detect the movement of the other equipment by finding the time when the light acceptance is disturbed. The method of current transformer is the way to detect the current increase by setting the current transformer around an power supplying electric wire of the equipment.

By using the devices cited above, the conventional methods establish the interface between these devices and the other equipment, and the working state of the equipment can be known through the signal exchange between these devices and the other equipment.

On the other hand, it is known that the operation of the electric equipment generates the electric noises, and various methods to detect and decrease the noise were given to keep them under noise regulation value. An example of the power noise filter is presented in U.S. Pat. No. 6,667,685. The decreasing method of the noise is presented in Japanese Patent Application Publication Laid-Open No. 2005-214902. The detecting device for common mode noise is presented in Japanese Patent Application Publication Laid-Open No. 1998-185962.

[Patent Document 1]
U.S. Pat. No. 5,570,418
[Patent Document 2]
U.S. Pat. No. 4,310,844
[Patent Document 3]
U.S. Pat. No. 6,667,685
[Patent Document 4]
Japanese Patent Application Publication Laid-Open No. 1999-55761.
[Patent Document 5]
Japanese Patent Application Publication Laid-Open No. 2005-214902.
[Patent Document 6]
Japanese Patent Application Publication Laid-Open No. 1998-185962

BRIEF SUMMARY OF THE INVENTION

However, the conventional methods for detecting the working state of the equipment require the installation of the interface circuit in the equipment itself. The interface circuit enables to monitor the working state by giving the output signal to show the working state. This installation of the interface circuit needs the partial remodeling of the equipment and requires the special electronic circuit knowledge.

From these situations, the conventional methods are applied on the occasion in which the special engineer can support and the remodeling is available. In another words, these conventional methods are not applicable onto the equipment used in the ordinary family house after purchase from the equipment store.

Especially, the electric equipment as television set, microwave oven, toaster or washing machine are difficult to be applied the remodeling of the interface circuit for the ordinary users.

Present invention enables to add an electronic apparatus with automatic judging function for the working state of the other equipment without remodeling the equipment itself.

In conventional methods, even in the case of using a photo coupler or a mechanical limit switch, it requires the various modification of the equipment to apply on the television set or microwave oven. The necessity to monitor and judge the working state of the various equipments is increasing in the ordinary family usage.

Accordingly, the object of the present invention is to offer an electronic apparatus with automatic judging function for the working state of the other equipment, which can be used without modifying the equipment and easily used by the ordinary user without the knowledge of the special electronic circuit.

The present invention offers the method to know and judge the working state of the other equipment without connecting electrically and modifying the said equipment. A portion of the paired electric wire for power supplying is clamped by the detecting device in the electronic judging apparatus of the present invention. As the working state is monitored by the said detecting device, there is no need to modify the equipment itself.

In the concrete method of the present invention, the common mode noise generated by the working of the equipment is measured and compared to the reference noise measured in the stopping period. When the measured common mode noise is larger than the reference noise, the judgment of the working is given.

It is not so hard to design the detector for monitoring the electric current change of the other equipment without connecting electrically. By using the current transformer, the monitoring of the current can be done from out side. But, the current transformer has to be set around the single electric power supplying wire, and it cannot be set around a paired power supplying wires. The separation of the usual paired power supplying wire requires the modification of the equipment already used in the family consumer usage.

From this reason, the present invention offers the method to monitor the common mode noise at around a paired power supplying wires without separating them. In this invention, the useful detecting device to set around the paired electric wires, and the actual electronic circuit to judge the working state by using the detected common mode noise are offered.

Furthermore the present invention offers the special composition of the circuit for judging the working state of the family use electronic equipment. Because the common mode noise leakage is restricted by the safety standard of the country and extremely low in the family use electronic equipments, the conventional method could not establish the detecting method of the common mode noise in family use electronic equipments economically.

Generally, the origin of the noise generation in the electronic equipment is considered being made by the sudden change of the current, voltage, electric charge or magnetic flux in the circuit devices.

The following examples are shown as the origins of the noise in the circuit devices. The abrupt change of the voltage or current on the open and shut working time is generated in the switching power supply or inverter circuit of the electronic equipment.

The noise is also generated by the abrupt current change in the rectifier for output or input electric power control. In the other case, the noise is caused by the leakage flux from the switching converter transformer. The noise is also caused by the in-rush current or ripple current on the condensers situated at the outlet portion of the power supply circuit or the inlet portion of the circuit connected with the power supply circuit.

Concerning about the noise level, when the working load of the electronic equipment become heavier, it increases together with the increase of the current level on the switching device. Therefore, the noise level changes according to the working state of the electronic equipment.

The noises caused by the electronic equipments are separated into two categories of normal mode noise and common mode noise. Though the reduction of the normal mode noise inside the electronic equipment is relatively easier, the reduction of the common mode noise is restricted by the following reason.

Even though the common mode noise is reduced by using the filter composed with the LFT (line filter transformer: indicated as LFT hereafter below in the present specification) and the condenser between the power supplying electric wire and the ground, the capacitance value of the condenser used together with the LFT is restricted by the safety standard from the view point of leakage current restriction.

From this reason, the usual measure for reducing the common mode noise is realized by choosing the larger value of the inductance for the LFT which is not restricted by the safety standard.

In order to increase the inductance value of the LFT, it is necessary to choose the higher effective inductance material for magnetic core or the larger winding number for coils in LFT.

Larger winding number increases the floating capacitance and decreases the impedance at high frequency. This situation makes the effect of noise reduction of LFT less than the expected.

On the other hand, the winding number for coils is also limited from the reason of heating by DC resistance in the coils. As can be understood according to the situation stated above, the reduction of the common mode noise is very difficult, and the some extent of the noise cannot be avoided to generate and leak out of the equipment. It is also known that the noise varies according to the working condition of the equipment.

Figure 5:
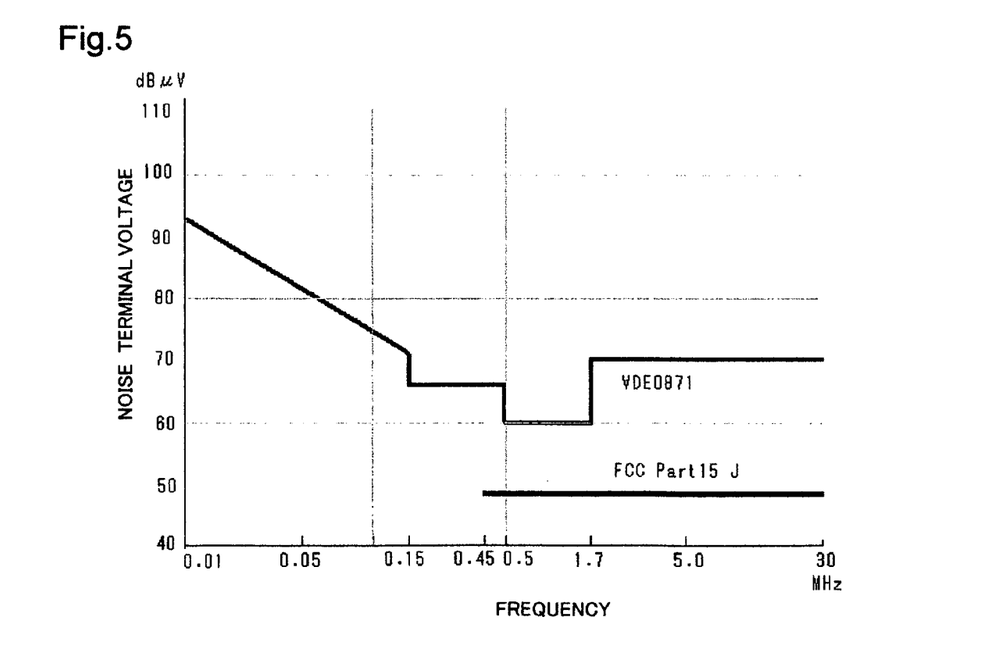
FIG. 5 is a graph for showing the restricted value for the noise terminal voltage in two noise regulations.

The noise level of the electronic equipment is restricted by the noise regulation for each country. The examples of the noise regulation are shown in FIG. 5. The returning noise from the equipment to the power line (noise terminal voltage) is restricted by FCC (Federal Communications Commission), CISPR22 (International Special Committee on Radio Interference) or VCCI (Voluntary Control Council for Interference by Information Technology Equipment in Japan) for example.

In general, the electronic equipments for consumer use have the noise level of ⅕ of the restricted value in the noise regulation. Concerning about the equipment for the industrial use, because the restricted value is not so hard compared to the consumer use, the confirmation of the noise level according to the condition for the consumer use equipment is enough to meet with the regulation.

The value for noise regulation is also restricted from the view point of the frequency region and the higher frequency region requires higher value for restriction and makes it harder to meet.

The frequency region measured by the detecting device of the present invention is under 1 MHz. As shown in the FIG. 5, the noise terminal voltage is not restricted under 0.45 MHz by FCC Part 15 J (class B). In the VDE0871 (Germany regulation), the noise terminal voltage is restricted under about 70 dB μV in lower frequency region than 100 KHz. Because of these regulations, the actual consumer equipments have the relatively larger noise terminal voltage under 1 MHz. The judging apparatus of the present invention specialize to detect the common mode noise in the lower frequency region under 1 MHz.

The common mode noise is detected in this frequency region by the detecting device installed in the electronic judging apparatus of the present invention. The measured common mode noise is converted into the direct-current voltage through the combined blocks of the filtering circuit, the amplifying circuit and the integration circuit with rectification.

Comparing the converted direct-current voltage with the reference voltage (the direct-current voltage measured on the non-working time of the equipment to be judged), the working state of the equipment is judged by the apparatus of the present invention. In another words, when the converted direct current voltage is higher than the reference voltage, the working state is judged as working.

The result of the judgment can be given as digital signal of ON-OFF, analogous output or digital output value with 8 bits after the AD conversion.

The result of the judgment can be stored in the data logger with the time data, and the output data also stored in the PC by using the various interfaces of USB, RS232C, serial port, parallel port or IEEE 1394.

The result data of judgment also can be sent directly by way of internet communication by uploading them. The uploading of data is actualized by attaching the internet interface with TCP/IP or UDP protocol to the judging apparatus of the present invention.

By dealing with the result of judgment in the internet communication through the apparatus as like as cellular phone, PC or PDA, the various applications, for example the control of the equipment, the monitoring of the running state and the discovery of the equipment trouble can be actualized.

Concerning about the applicable equipment for the judging apparatus of the present invention, the following examples are listed as the equipments easier to generate the common mode noise. The first group is the various electronic equipments installed with the switching electric power supply, a DC-DC converter or an electronic oscillating device, which include TV, the recording and reproducing equipment of the picture on TV as VTR, PC (personal computer) and microwave oven.

The second group is the light with electric discharge phenomenon like fluorescent light. The third group is the equipment with the electronic inverter, and which includes a light with the brightness controller, a refrigerator, an air conditioner, a washing machine, an inverter cooking machine or a rice cooker with induction heating.

On the other hand, an electric heater and an incandescent lamp are hard to be judged by the apparatus of the present invention, because the common mode noise can be less detected.

Even after the equipment to be judged the working state by the present invention is already installed at the user's site, the equipment can be judged without modifying the equipment itself, because the working state can be detected without contact to the equipment by the present invention. From this reason, the adaptability of the present invention is very wide.

As the electric contact to the circuit of the equipment to be judged is not necessary for applying the present invention, the safe installation can be done with cheaper cost.

Furthermore, as the judging equipment with the detector of the present invention can work as the LFT itself, it also works to decrease the noise of the equipment to be judged.

DETAILED DESCRIPTION OF THE INVENTION

Hereinafter, the preferred embodiments of the present invention are described precisely by using the figures. For example, the electronic judging apparatus for the working state of the other equipment is actualized by using the electronic circuit 100 as shown in FIG. 1.

Figure 1:
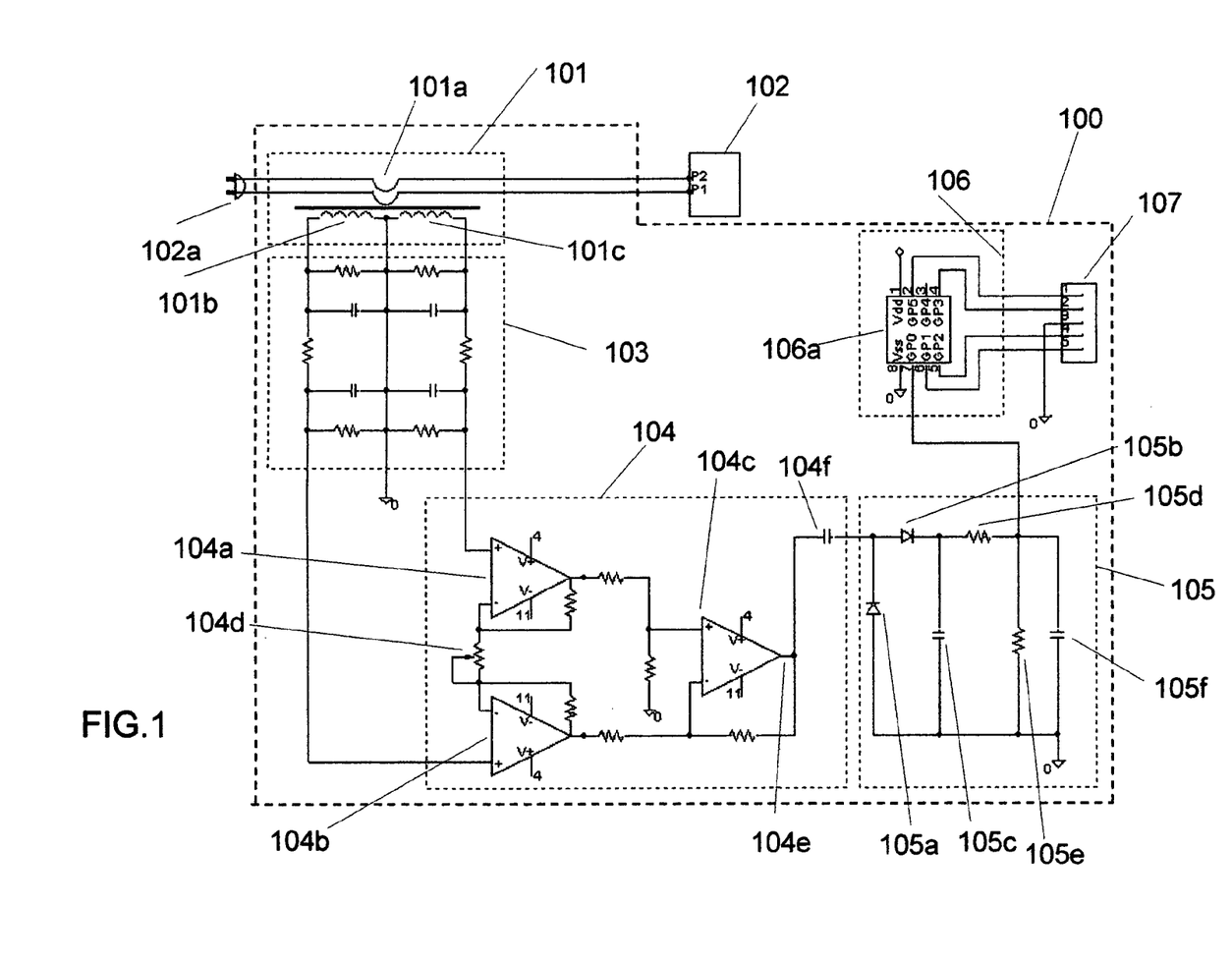
FIG. 1 is a block diagram of the circuit dealing with the signal from the detecting device used in the present invention.

It is understood that the circuit of FIG. 1 is constructed mainly from the five block portions with each function of the circuit unit. As surrounded by each broken line, the five portions are composed of the detecting function block 101, the filter function block 103, the differential amplifying function block 104, integration circuit block with rectification 105 and AD converting circuit block with digital signal treatment 106.

The signal output interface 107 is situated between the AD converting circuit block 106 and the outer connection to send the output. The other electronic equipment 102 to be judged the working state has paired electric wires for power supplying and is connected with the plug 102a.

Figure 2:
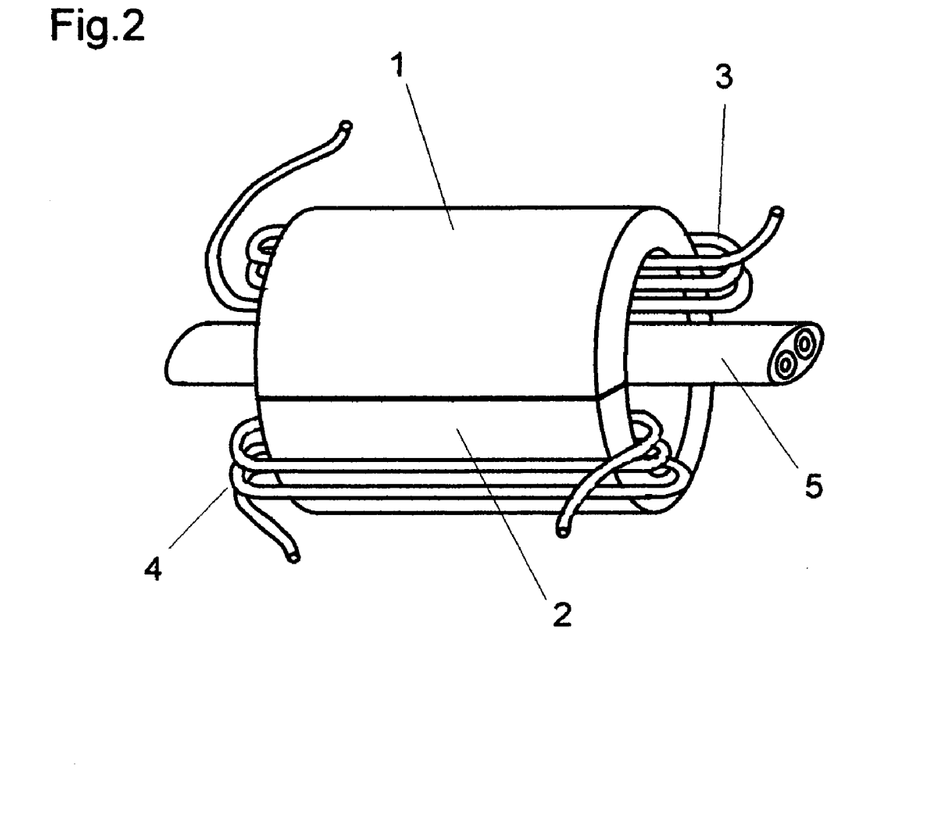
FIG. 2 is a perspective view of the detecting device used in the present invention, which shows the view to be fixed to surround a pair of the power supplying electric wires.
Figure 3:
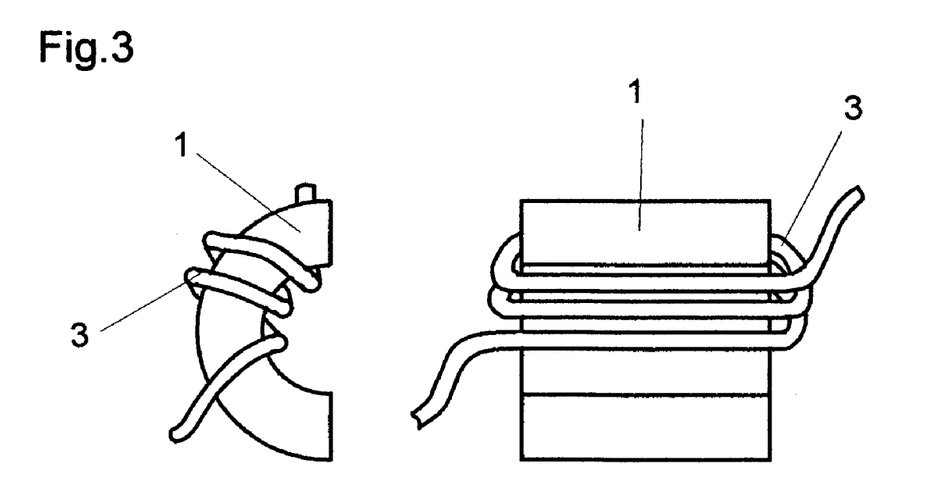
FIG. 3 shows a plane figure and a side view of the C shaped core for detecting device of the present invention.
Figure 4:
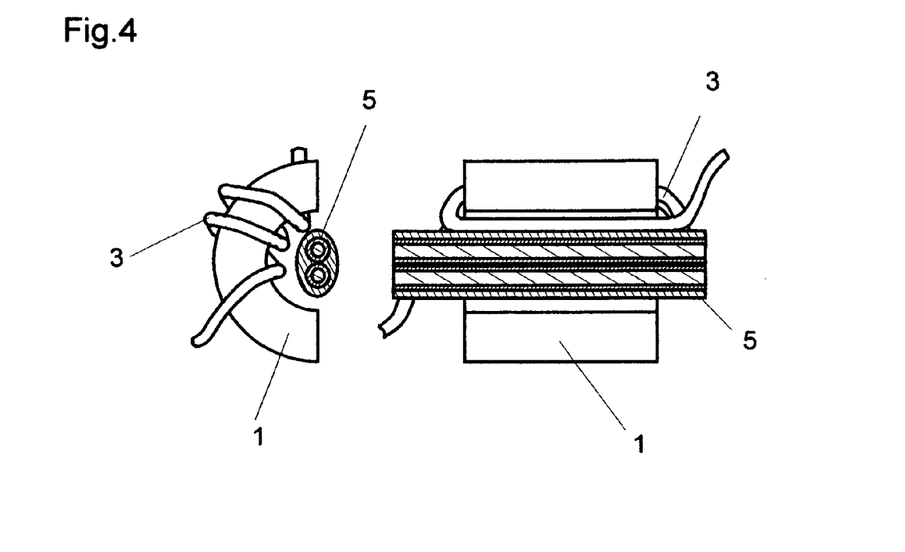
FIG. 4 shows a plane figure of C core with the section view of the power supplying electric wire and a side view of C core with the other sectional view of the power supplying wire.

FIGS. 2, 3 and 4 are the schematic diagram of the C shaped ferrite cores used in the detecting circuit portion 101 of FIG. 1. FIG. 2 shows the assembled view of the two C shaped ferrite cores 1 and 2, the two thin detecting wires 3 and 4, and the thick power supplying electric wire 5 of the equipment to be judged the working state.

FIG. 3 shows a plane figure and a side view of the C shaped ferrite core for detecting device of the present invention. The left side figure shows the view perpendicular to the power supplying wire 5 and the right side figure shows the view parallel to the power supplying wire 5 of the equipment to be judged.

FIG. 4 shows a plane figure of C core with the section view of the power supplying electric wires and a side view of C core with the other section view of the power supplying wires. The section of the power supplying wires in the left figure is shown for the section face perpendicular to the longitudinal direction. The section view of the right side is shown for the section face parallel to the longitudinal direction of the wires and just at the center of the paired wires. The C shaped ferrite cores as shown in FIGS. 2, 3 and 4 are used in order to detect the common mode noise.

In the verification of the present invention, from the view point of the good response in high frequency region and the good insulation characteristics, the cores made of Ni—Zn ferrite were used for the C shaped cores Though the winding number of the each detecting wires is 3 in the FIG. 2 for the easy understanding, the actual number is much more. Enameled cupper wire of 0.2 mm diameter (Φ0.2-1 UEW) was wound 15 times around the each C shaped core 1 and 2 of FIG. 2. Each wound enameled wire works as the detecting wire and shown as 3 and 4 in FIG. 2. The power supplying wire 5 of the equipment to be judged is clamped between the two C cores as shown in FIG. 2.

The detecting circuit block portion with the composition of the two C shaped ferrite cores explained above is shown as 101 in FIG. 1. The common mode noise current generated from the other equipment 102 to be judged flows in the power supplying wire between the electric power terminals (P1, P2) and the plug 102a of the equipment.

The power supplying wire is clamped with the two C cores of the detecting circuit portion 101. The clamped portion on the power supplying wire corresponds to 101a in the block diagram of FIG. 1. The power supplying wires may go through the ferrite core ring instead of the two C shaped ferrite cores. In such a case, the position to go through the ferrite core ring also corresponds to 101a in FIG. 1. The detecting wires of the detecting device are shown as 101b and 101c.

The common mode noise current, which is generated from the other equipment 102 and transmitted in the power supplying wire with the clamped portion 101a, derives the induced current inside the detecting coils 101b and 101c and gives the induced voltage at the both end of the coils 101b and 101c.

The derived voltage by induction at both ends of the coils 101b and 101c are passed to the filter circuit portion 103 and the useful low frequency region of the common mode noise is selected and input into the differential amplifying circuit portion 104.

The paired detecting coils 101b and 101c are used to eliminate the influence of the outer noise as low as possible. In the case of the lower outer noise or the larger detected common mode noise from the equipment to be judged, a single detecting coil can be used.

When a TV set was applied as the equipment to be judged, the derived voltage at both ends of the detecting coils 101b and 101c was 10 mVp-p on the time of non-working. (The actually measured wave form on the standby time of the TV set is shown on the upper portion in FIG. 6 and this is almost as same as the one on the non-working time.)

Figure 6:
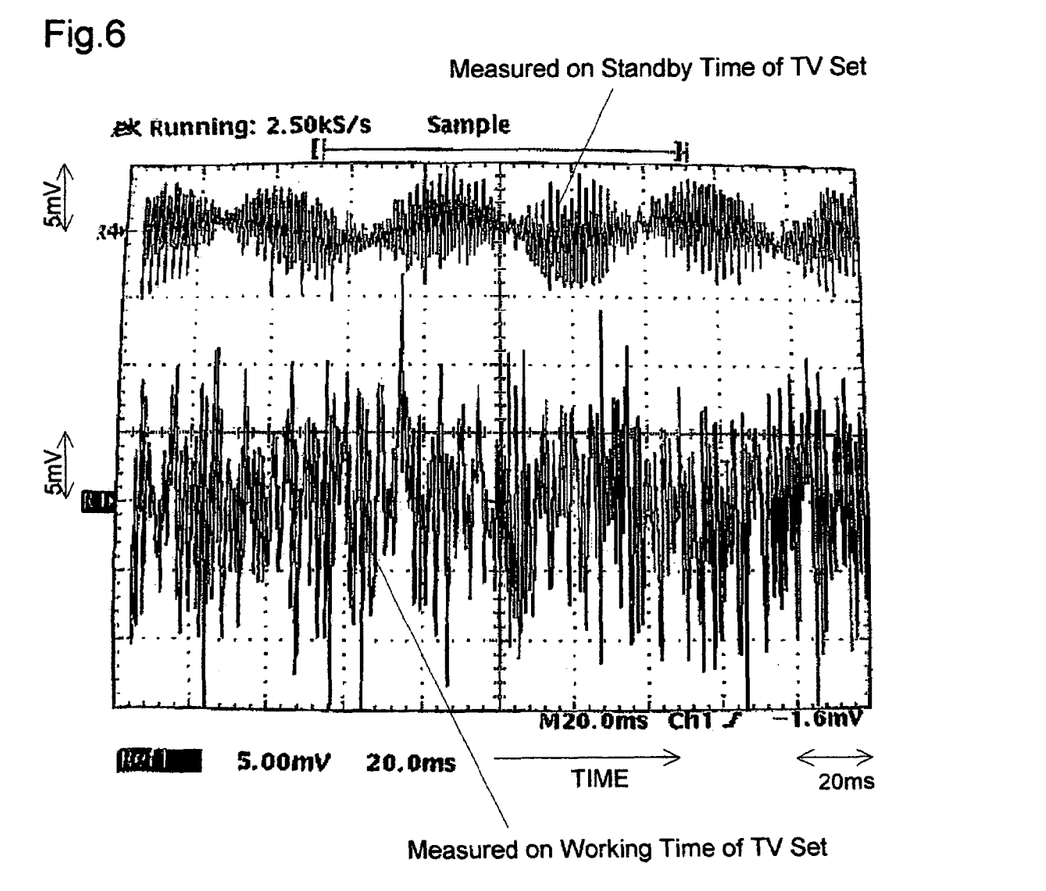
FIG. 6 is the actual figures of the detected signals measured by the detecting device of the present invention on the stopping time and the working time of the equipment to be judged.

When a TV set was switched on, the derived voltage at both coil ends was 30 mVp-p (The actually measured wave form on the working time of the TV set is shown on the lower portion in FIG. 6). This noise current is flown into the filter portion 103, and this filter portion restricts to pass the outer noise, the useless higher frequency signal and the higher modulated frequency signal. This lower frequency noise current (under 1 MHz) is used as the signal to judge the working state.

Concerning about the configuration of the filter portion 103, the low pass filter of Π shape type with resisters and condensers was used. The other types of the filters can be used on the condition that they have no influence to the detecting function portion in the low frequency region.

The output signal from the filter portion 103 is restricted for the passing frequency region, and the lower frequency signal than 1 MHz only can pass the filter portion to become the input signal to the differential amplifying portion 104. Actually, according to the FCC Part 15 J (class B), as the common mode noise is restricted over 450 KHz, more common mode noise is detected under 450 KHz frequency.

The differential amplifying portion 104 is including the OP (operational) amplifier circuit 104a and 104b to amplify the small signals. The reason why to use the differential amplifier is that the same phase signals in the outer coming noise can be canceled.

The output from the OP amplifier circuit 104a and 104b is used as the input to the OP amplifier circuit 104c. By using these amplifiers arrangement, the signal amplifying of about 100 dB was gained in the differential amplifying portion 104 totally. The variable resister 104d can be used to control the amplifying ratio.

Though the direct current amplifying circuit is used in the FIG. 1, which enables the good amplifying performance in the super-low frequency region by controlling the offset of the OP amplifier, the alternate current amplifying circuit also can be used, which is easier to apply the bias control or the offset control by eliminating the DC component through the condenser insertion.

For the output from the differential amplifying circuit 104, the voltage was gained as ranged from 1 V p-p (on standby time or non-working time) to 3 V p-p (on working time). The output voltage measured on the non-working time is the back ground noise, which is detected on the power supplying wires of TV set and is considered to be the noise generated from the other electronic equipments connected to the same power supplying wires.

The alternating signal flown into the integration circuit with rectification 105 is rectified by the diodes 105a and 105b with the condenser 105c. After flowing through the integral circuit portion with the resister 105d and the condenser 105f, the rectified current is given to the AD converting circuit block with digital signal treatment 106. The resister 105e works to discharge for the condenser 105f in the integral circuit.

The signal transmitted to the input port of the micro computer 106a is processed in the AD converting circuit portion with digital signal treatment 106. The micro computer 106a is one chip micro computer with the various functions, which include input and output ports for analog and digital electronic treatment, AD converter, clock oscillator and memories. These memories include EEPROM, RAM and ROM. An example of the micro computer is PIC12F675 by Microchip Technology Inc.

The analog signal transmitted to the input port of AD converting portion with digital signal treatment 106 is converted into the digital signal. The converted digital signal is processed through the moving-average filtering by the software installed in the micro computer 106a and taken out of the output port of the micro computer together with the time data. The output digital data are transmitted to the other PC from the output interface 107.

The way of judgment for the detected signal is performed as follows and the judged result is given as the output. Concerning about the default value in the EEPROM, the digital value to correspond to the 1 V p-p is registered. The output signal from the integration circuit block with rectification 105 is compared to the reference value of 1 V p-p and the judged result is given according to judgment criteria.

The judgment criteria for comparison is including the time length in which the voltage is detected to be larger than the reference voltage, the number to become larger than the reference voltage during the unit time and the variation itself of those values. According to those values, the judgment is performed totally.

For example, the judgment of the other equipment to be in the working state can be given from the criteria of the time, in which the detected and amplified voltage of the common mode noise is larger than the reference voltage and continued longer than 1 minute. Various ways for judgment can be available.

The reference value can be applied with not only the default value installed from the beginning but also the value changed later by the user. When the AD converted value on the non-working time of the equipment to be judged is read and recorded into EEPROM of the micro computer 106a by using the outer command as like as the switch, this AD converted value can be used as the reference value. The actual example of the output signal is shown in the FIG. 7.

Figure 7:
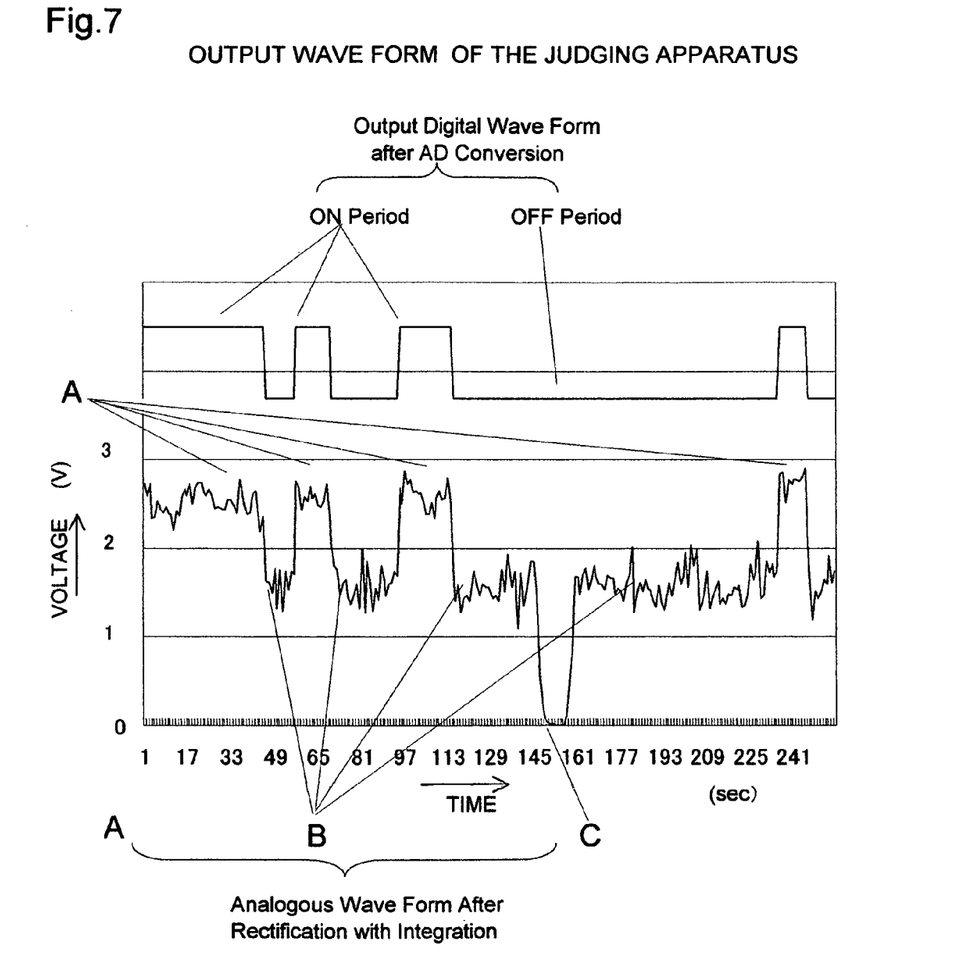
FIG. 7 is the actual figures of the output signals in the judging apparatus of the present invention.

FIG. 7 shows the two wave forms in actual operation of the electronic judging apparatus for the present invention. The wave form shown in the lower area is the one measured at the output position of the integration circuit block with rectification 105 in FIG. 1. The periods shown by A character in FIG. 7 correspond with the period for working of the other equipment to be judged. The periods shown by B character correspond with the standby time or the stopping time. The period shown by C character corresponds to the time to switch off the detecting device 101.

The wave form shown in the upper area of FIG. 7 is the one measured at the output position of the AD converting circuit block with digital signal treatment 106, which shows ON digital signal for the working period of the analogous wave form shown in the lower area of FIG. 7. On the other hand, the OFF digital signal is shown for the periods of standby time in the other equipment 102 or the periods of switching off in the detecting device 101.

The interface treatment of the output signal can be set by applying USB, RS232C, Serial Port, Parallel Port or IEEE1394, which enables to communicate with PC. By installing the interface for the internet inside the electronic judging apparatus of the present invention itself, the uploading the data on the internet communication can be available directly with protocol of TCP/IP or UDP.

The data uploaded on the internet system can be utilized for the various situations, which include the watching of the equipment working state and the discovery of the wrong working condition from a distance.

(The other Example)

Concerning about the detecting device installed inside the electronic judging apparatus of the present invention, a pair of the C shaped ferrite cores was explained. The other type cores including a pair of the U shaped ones or a pair of the U and I shaped ones can be used.

The other type is also available for the detecting device. An example is the toroidal ferrite core with the wound wires for the signal detecting. The electric power supplying wire of the other equipment to be judged is inserted into the toroidal core.

Related to the wire wound around the ferrite core, it is effective to use the paired wires or the twisted wires instead of the single enameled wire in order to eliminate the same phase noise or to keep the signal balance.

In the explanation shown above with FIG. 1, the detecting device is applied with the electromagnetic induction coupling method. The other methods also can be applied for detecting the common mode noise around the power supplying wires of the other equipment. The method to measure the voltage change between the two electrode plates is called as the electro static coupling method. The method to use the magnetic detecting device as like as the Hall-effect device is also available to measure the noise in magnetic field. These methods are effectively used for the detecting device in the present invention.

As described above, the common mode noise detected around the electric power supplying wire of the other equipment is used for the judgment of the working state of the equipment. The common mode noise is transmitted to the particular electronic circuits of the present invention, which are composed of the filter function for passing under 1 MHz frequency, the differential amplifying function, integration circuit with rectification and AD converting circuit with digital signal treatment.

Especially, the low pass filter under the frequency of 1 MHz in the analogous circuit and the moving-average filtering in the digital signal treatment are the particular portions in the present invention.

Furthermore, the circuits from the filter function to the differential amplifying function can be made in an IC. By situating this IC around the electric power supplying wire together with the C shaped cores of the detector, the judging apparatus can be made tough against the disturbing outer noise on the case the distance between the detecting devise and the apparatus itself is very long.

What I claim as my invention is:

1. An electronic apparatus with an electronic judging function for a working state of an other electric equipment by measuring an electric common mode noise current passing through a power supplying electric wire to the said other electric equipment and by comparing the electric common mode noise current value on measuring time with the electric common mode noise current value on non-working time of the said other electric equipment, wherein the electric common mode noise current is measured by using ferrite magnetic cores with paired electric winding wires or twisted electric winding wires situated at around the power supplying electric wire to the said other electric equipment; and wherein the electric common mode noise terminal voltage value is ranged under the line connected between the two points of (10 KHz, 91 dB μ V) and (150 KHz, 70 dB μ V) in the frequency region from 10 KHz to 150 KHz on the rectangular coordinates figure shown with the vertical linear axis for Noise Terminal Voltage and horizontal logarithmic axis for Frequency; and wherein the electric common mode noise terminal voltage value is ranged under 65 dB μ V in the frequency region from 150 KHz to 450 KHz on the rectangular coordinates figure shown with the vertical linear axis for Noise Terminal Voltage and horizontal logarithmic axis for Frequency; and wherein the electric common mode noise terminal voltage value is ranged under 45 dB μ V in the frequency region from 450 KHz to 30 MHz on the rectangular coordinates figure shown with the vertical linear axis for Noise Terminal Voltage and horizontal logarithmic axis for Frequency.

2. An electronic apparatus with the electronic judging function for the working state of the other electric equipment by measuring the electric common mode noise current passing through a signal sending electric wire connected to the said other electric equipment and by comparing the electric common mode noise current value on measuring time with the electric common mode noise current value on non-working time of the said other electric equipment, wherein the electric common mode noise current is measured by using ferrite magnetic cores with paired electric winding wires or twisted electric winding wires situated at around the signal sending electric wire to the said other electric equipment; and wherein the electric common mode noise terminal voltage value is ranged under the line connected between the two points of (10 KHz, 91 dB μ V) and (150 KHz, 70 dB μ V) in the frequency region from 10 KHz to 150 KHz on the rectangular coordinates figure shown with the vertical linear axis for Noise Terminal Voltage and horizontal logarithmic axis for Frequency; and wherein the electric common mode noise terminal voltage value is ranged under 65dB μ V in the frequency region from 150 KHz to 450 KHz on the rectangular coordinates figure shown with the vertical linear axis for Noise Terminal Voltage and horizontal logarithmic axis for Frequency; and wherein the electric common mode noise terminal voltage value is ranged under 45 dB μ V in the frequency region from 450 KHz to 30 MHz on the rectangular coordinates figure shown with the vertical linear axis for Noise Terminal Voltage and horizontal logarithmic axis for Frequency.

3. An electronic apparatus with the electronic judging function for the working state of the other electric equipment according to claim 1 or 2, wherein an electronic circuit with the electronic judging function for the working state of the other electric equipment includes a differential amplifying portion with three OP amplifier circuits for amplifying the electric common mode noise.

* * * * *